United States Patent [19]

Fisher et al.

[11] Patent Number: 5,216,581
[45] Date of Patent: Jun. 1, 1993

[54] ELECTRONIC MODULE ASSEMBLY AND METHOD OF FORMING SAME

[75] Inventors: Timothy S. Fisher, Bensenville; Michael I. Petrites, Schaumburg; Al Ocken, Palatine, all of Ill.

[73] Assignee: Motorola, Inc., Schaumburg, Ill.

[21] Appl. No.: 914,295

[22] Filed: Jul. 16, 1992

Related U.S. Application Data

[60] Continuation-in-part of Ser. No. 835,817, Feb. 18, 1992, Pat. No. 5,159,751, which is a division of Ser. No. 474,873, Feb. 5, 1990, Pat. No. 5,103,375.

[51] Int. Cl.$^5$ .............................................. H05K 7/20
[52] U.S. Cl. .................................. 361/392; 361/386; 361/398; 439/76
[58] Field of Search ........................... 361/386-389, 361/380, 392, 398, 424, 395, 399, 412, 413; 165/80.3, 185; 29/829, 832, 846; 439/67, 76, 77, 485, 487; 174/35 R, 252, 254

[56] References Cited

U.S. PATENT DOCUMENTS

| | | | |
|---|---|---|---|
| 3,816,911 | 6/1974 | Knappenberger | 29/626 |
| 4,811,165 | 3/1989 | Currier et al. | 361/386 |
| 4,958,260 | 9/1990 | Kobayashi et al. | 361/398 |
| 5,103,375 | 4/1992 | Cottingham | 361/386 |
| 5,159,751 | 11/1992 | Cottingham | 29/832 |
| 5,170,326 | 12/1992 | Meny | 361/395 |
| 5,179,501 | 1/1993 | Ocken | 361/388 |

Primary Examiner—Gerald P. Tolin
Attorney, Agent, or Firm—John H. Moore; Phillip H. Melamed

[57] ABSTRACT

A one-piece electronic module assembly is formed from a substantially rectangular baseplate on which an insulating film is mounted to carry circuit components. An enclosed assembly is completed by initially providing a pair of major bend axes across the baseplate, and forming inwardly extending notches at selected locations along lengthwise edges of the baseplate. The baseplate is bent at the notches to form a front wall, a pair of sidewalls and tabs that overlap the sidewalls. The baseplate is then bent over on itself along the major bend axes and sealed, if necessary, to form a completed assembly.

1 Claim, 3 Drawing Sheets

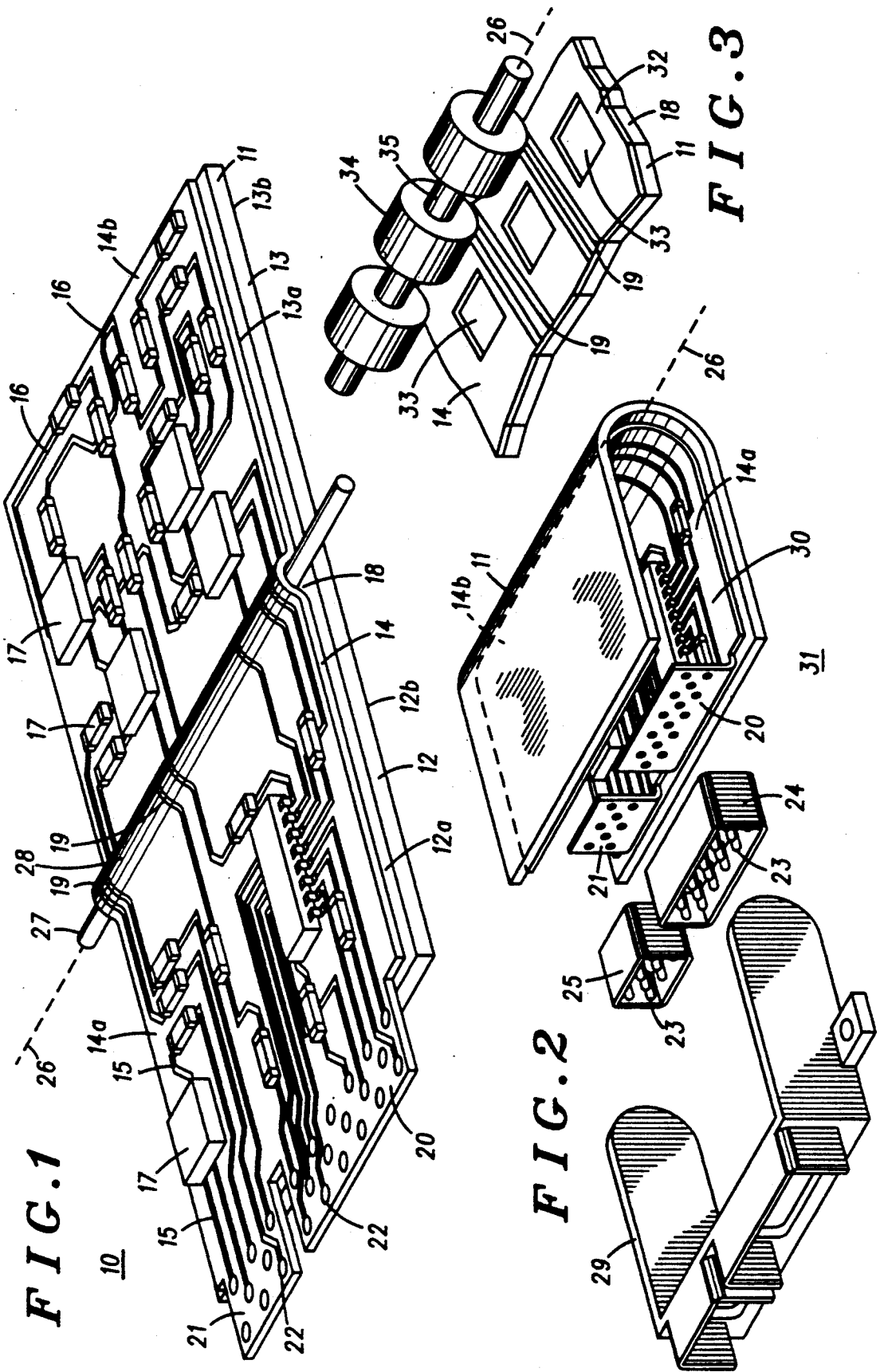

ELECTRONIC MODULE ASSEMBLY AND METHOD OF FORMING SAME

CROSS REFERENCE TO RELATED APPLICATIONS

This application is a continuation-in-part of U.S. application Ser. No. 835,817 filed Feb. 18, 1992 (now U.S. Pat. No. 5,159,751), which is a division of U.S. application Ser. No. 07/474,873, filed Feb. 5, 1990 (now U.S. Pat. No. 5,103,375 and referred to herein as the parent application).

FIELD OF THE INVENTION

The present invention relates to electronic module assemblies. More particularly, the present invention is directed to providing an electronic module having an external housing for protecting components located within the module housing.

BACKGROUND OF THE INVENTION

Prior electronic module assemblies are known in which a polyimide flex circuit undergoes planar assembly in which a plurality of components are mounted on conductive circuit patterns on a polyimide film. A plurality of rigidizers plates are provided under various portions of the flex circuit film, and after component assembly the rigidizer plates are oriented so they are non-coplanar. Then the rigidizer plates are mounted to an external protective housing for the module. This prior art module assembly and method requires the additional manufacturing step of mounting the rigidizer plates to the external protective housing. This mounting step may degrade the thermal conduction between the rigidizer plate and the external housing wherein this thermal conduction may be relied upon for providing heat sinking for the components in the assembly which are mounted on the flex circuit film. Also, the providing of the external housing typically represents a significant cost of the module.

BRIEF DESCRIPTION OF THE DRAWINGS

The present invention can be better understood by reference to the drawings in which:

FIG. 1 is a perspective view of a planar flex circuit subassembly as described in the parent U.S. application;

FIG. 2 is an exploded perspective view of an electronic module assembly which utilizes the flex circuit subassembly shown in FIG. 1 after that assembly is bent into a desired shape;

FIG. 3 is a partial perspective view of a flex circuit subassembly similar to that shown in FIG. 1 for which an alternative bending step is contemplated;

DESCRIPTION OF THE PREFERRED EMBODIMENT

Figure 4:
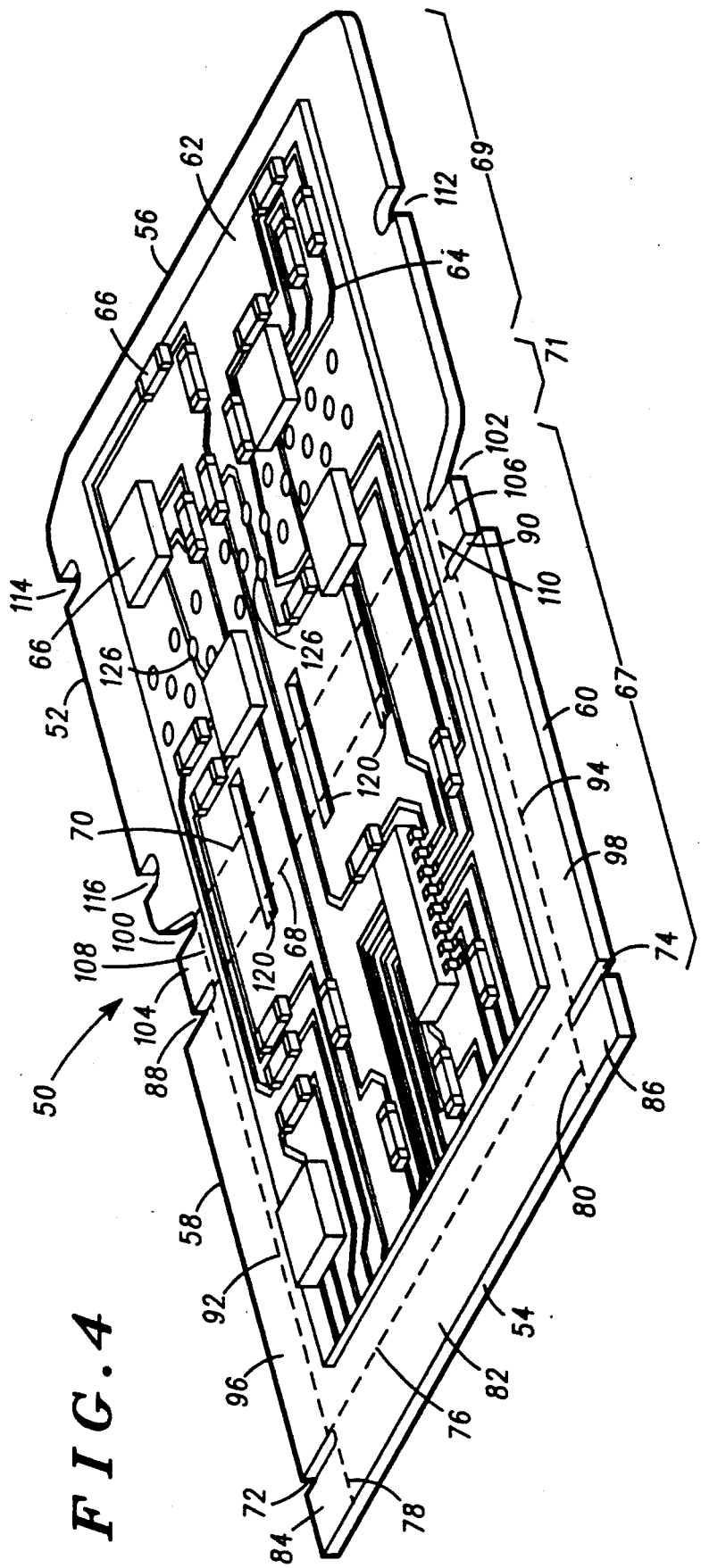
FIG. 4 is a perspective view of an electronic module assembly constructed according to the present invention, wherein a baseplate portion of the assembly is shown in a planar form prior to being bent into its final shape.

Referring to FIG. 1, a planar flex circuit subassembly 10, as disclosed in the parent U.S. application, is illustrated prior to a bending operation. The subassembly 10 comprises a rigid thermally conductive planar aluminum base plate 11 having integral first and second portions 12 and 13 each having its own planar top and bottom surfaces 12a, 12b, 13a and 13b, respectively. A preformed sheet of polyimide insulating film 14 is bonded to the first and second base portion top surfaces 12a and 13a. Preferably, prior to any bending of the base 11, first and second electrically conductive circuit patterns (traces/metalizations) 15 and 16 are provided on portions 14a and 14b of the polyimide film which are bonded to the top surfaces 12a and 13a, respectively. A plurality of discrete electrical components 17 are provide on and connected to each of the first and second circuitry patterns 15 and 16.

The aluminum rigidizer base plate 11 has an integral intermediate portion 18 between the first and second portions 12 and 13, and circuit paths (metalizations) 19 on the flex circuit film 14 interconnect the first and second circuitry patterns 15 and 16 and the components 17 located on each of the top surfaces 12a and 13a. The flex circuit film 14 has a pair of nonbonded and nonsupported integral extending portions 20 and 21 each having a plurality of holes 22 therein adjacent conductive metalizations. These holes are intended for subsequent mating connection to electrical contact pins 23 of a pair external electrical connectors 24 and 25 shown in FIG. 2. These connections are to be made by conventional soldering techniques, as are the connections between the components 17 and the conductive circuit patterns 15 and 16. The components 17 are soldered to the circuit patterns 15 and 16 by reflow solder techniques while the surfaces 12a, 13a, 14a, and 14b are essentially coplanar. Each of the connectors 24 and 25 has its own associated rigid plastic housing. If possible only a signal connector might be usable.

The structure which has so far been described above is conventional. However, due to final packaging form requirements it may sometimes be desired to have the rigidizer plate portions 12 and 13 oriented in a final non-coplanar configuration. In such a case, previously these rigidizer portions would typically be provided as separate nonintegral plates or planar integral plates connected by removeable or breakable runners to facilitate reorienting the plates in a subsequent non-coplanar configuration. These plates would then also be mechanically, and possibly thermally, bonded to an external module housing which would provide mechanical protection for the components 17. However, the invention disclosed in the parent application, as well as the present invention, contemplate alternative structures and manufacturing methods to achieve these alternative structures.

Referring to FIG. 1, an axis 26 is illustrated about which the integral rigidizer plate 11 will be bent by a sheet metal bending process after the components 17 have been soldered to the conductive circuit patterns 15 and 16. The axis 26 is shown in FIG. 1 to be substantially coincidental with the axis of a mandrel shaft 27 positioned on the top surface of the plate 11 and beneath a nonbonded loop portion 28 of the flex film 14. The interconnecting circuit paths 19 are provided on this loop portion 28 which is oriented generally along the axis 26. It is contemplated that the mandrel shaft 27 is utilized during the bending of the rigidizer plate 11 into a final desired C shape configuration as shown in FIG. 2. The nonbonded loop portion 28 of the flex film 14 provides an intermediate integral film portion that connects film portions 14a and 14b on which the conductive circuit patterns 15 and 16 are provided on, respectively. Prior to or after the desired bending step, the electrical pins 23 of the connectors 24 and 25 are joined to the circuit patterns adjacent the through holes 22 in the extending flex tabs 20 and 21. After the bending step an additional module enclosure assembly portion 29, which may comprise a plastic molded component, is mated to and joined to the bent rigidizer base plate 11 and the connectors 24 and 25. This substantially encloses an interior space 30 effectively bounded by the top surfaces 12a and 13a of the bent rigidizer plate, the connectors 24 and 25 and the enclosure portion 29. Note that some details of the components 17 and metalizations within the space 30 are not shown in FIG. 2.

After the bending operation, the first and second rigidizer plate top surfaces 12a and 13a are non-coplanar and the bottom surfaces 12b and 13b now form the external surface of a protective housing for the components 17 which are located in the interior space 30. The connectors 24 and 25 and the enclosing portion 29 form the rest of the protective housing for the components 17. Assembly of the module components shown in FIG. 2 results in an electronic module assembly 31 which requires no additional external protective housing since the bent rigidizer plate 11, the enclosing portion 29 and the electrical connectors 24 and 25 provide the desired protective housing. The connectors provide external electrical access to the components 17. In addition, there is no required thermal connection of the rigidizer plate 11 to an external housing for heat sinking unless additional heat sinking capacity, in addition to than that provided by the rigidizer plate 11, is required. The plate 11 already provides some heat sinking since it has a significant thermal mass.

Preferably, the electronic module assembly 31 can be implemented while providing a hermetic seal for the interior space 30. The plastic enclosing portion 29 could have plastic posts which were ultrasonically deformed over the rigidizer plate 11 to provide the desired final assembly. Alternatively, epoxy or some other adhesive could be utilized to form a hermetic seal and/or bond the enclosing portion 29 and connectors 24 and 25 to the bent rigidizer plate 11.

The providing of the loop portion 28 of the flex circuit is significant in that it permits minimizing stress applied to the flex circuit adjacent the bending axis 26 during the bending operation. The presence of loop 28 takes up stress which might be applied to the interconnects 19 during any bending of the base 11 and also allows the mandrel shaft to directly contact the base 11 during bending without applying pressure through the film 14 which might rupture or scratch the interconnects 19. Such a feature is useable whenever it is desired to bond a flex circuit portion to a planar rigidizer plate, planarly assemble components thereon, preferably by conventional reflow soldering techniques, and then subsequently bend the rigidizer plate into a desired shape. This technique is particularly useful when the flex circuit comprises a preformed sheet of insulating material, such as film 14, having conductive metalization patterns thereon prior to the bending of the rigidizer plate.

FIG. 3 illustrates an alternate technique for accomplishing a desired bending of the rigidizer plate 11. In FIG. 3, only a central portion of the rigidizer plate 11 and the flex circuit film 14 bonded thereto is illustrated. In FIG. 3, a central portion 32 of the flex circuit film 14 is provided on intermediate portion 18 with a plurality of openings 33 therein generally along the bend axis 26. The openings 33 mate with a plurality of raised portions 34 of a mandrel 35 shown in FIG. 3. The interconnecting circuit paths 19 are provided on the central film portion 32 between the openings 33. During the bending process as contemplated by the structure shown in FIG. 3, the raised portions 34 of the mandrel 35 will directly contact the top surface of the rigidizer plate 11 through the openings 33, but portions of the mandrel between the raised portions 34 will not contact or press against the interconnecting circuit paths 19 during the bending process. This prevents the mandrel from scratching or otherwise disrupting the circuit patterns 19 or the film 14 during the bending process while still allowing the mandrel to provide force against the rigidizer plate 11 during the bending process. This technique could be used if the film 14 were first deposited on the base 11, the metalizations 15, 16 and 19 were then applied to the film, and then the base 11 were bent.

FIG. 3 shows how to use a mandrel having raised portions 34 in conjunction with holes 33 in the film 14. However, it is also possible to obtain suitable results without providing the holes 33, as long as the interconnections 19 are positioned, as shown in FIG. 3, between the raised portions 34 during the bending process.

Referring now to FIG. 4, another form of electronic module assembly 50 is shown that incorporates some of the features of the above-described assembly, plus additional features that enhance its manufacturability. This module assembly 50 includes a metal (preferably aluminum) baseplate 52 that is substantially rectangular in shape. It has a pair of substantially parallel width-wise edges 54 and 56, and a pair of substantially parallel length-wise edges 58 and 60. These edges bound a central inner surface of the baseplate on which an insulating film 62 is mounted. The film 62 may be polyimide, for example, and carries on its upper surface pre-formed electrical circuit paths 64 and electronic components 66.

Figure 6:
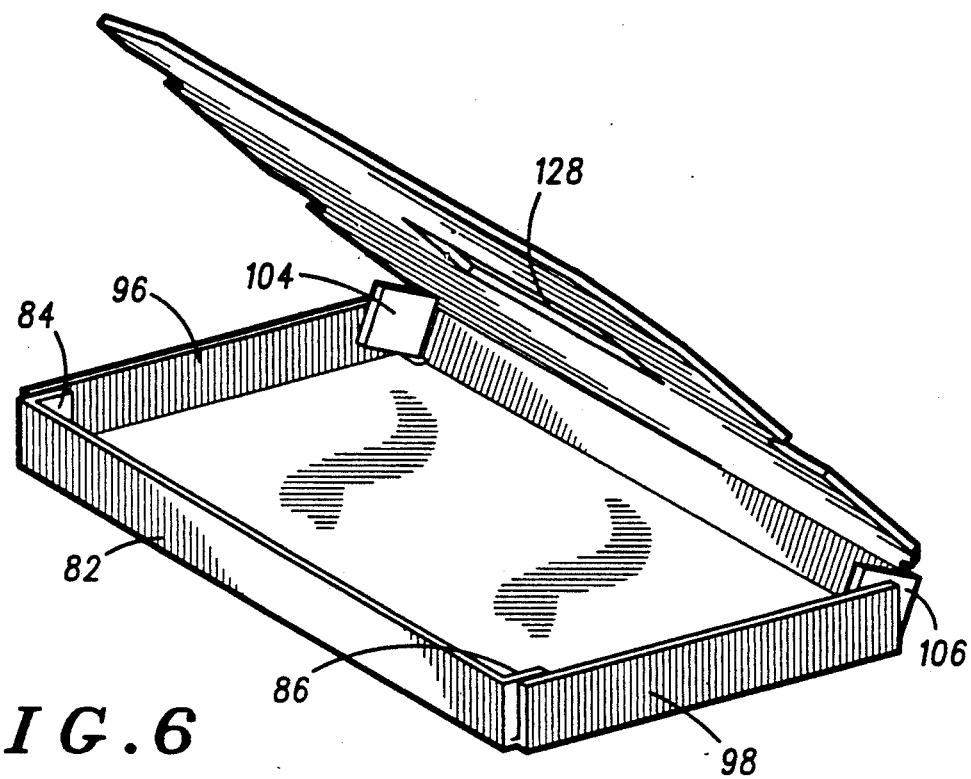
FIG. 6 is a perspective view of the electronic module assembly of FIG. 4 after the baseplate has been partially bent into its final shape.

The baseplate 52 will be bent, as described below, along a pair of major bend axes 68 and 70 that extend across the width of the baseplate. FIG. 6 shows how this, and other bending steps to be described, result in a nearly enclosed assembly, and FIG. 7 shows the same assembly after all bending has been completed.

Figure 7:
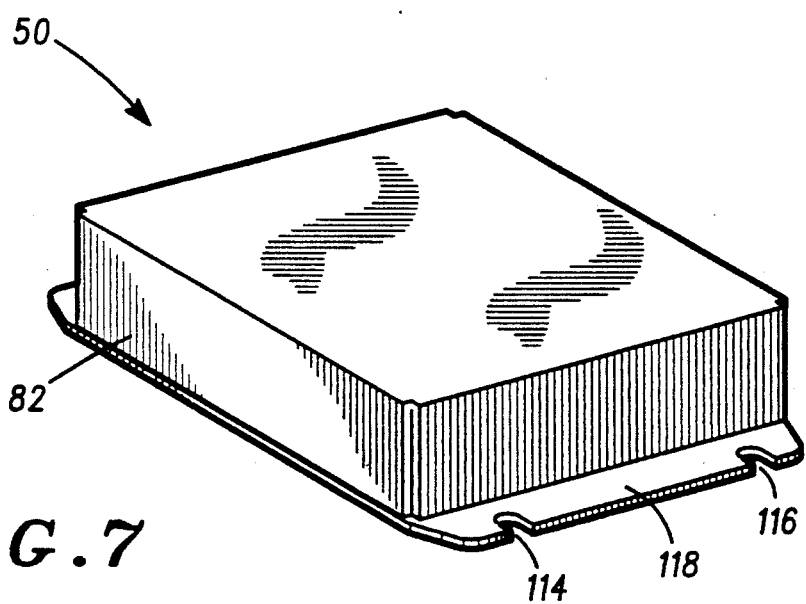
FIG. 7 is a perspective of the electronic module assembly of FIG. 4 after the baseplate has been completely bent into its final shape.

It will be seen that no additional pieces or components are needed to provide the completed assembly shown in FIG. 7. This desirable result flows from the way in which the assembly 50 (FIG. 4) is first constructed and then formed, as will be described.

Returning again to FIG. 4, the major bend axes 68 and 70 can been seen as dividing the baseplate 52 into three parts: a first part 67 that is located on one side of both major axes, a second part 69 that is located on the opposite side of both major bend axes, and a third part 71 that is located between the major bend axes. These first and third parts 67, 71 of the baseplate include a number of notches that extend inwardly from the lengthwise edges 58 and 60. A first notch 72 extends inwardly from the edge 58, and a second, oppositely facing notch 74 extends inwardly from the edge 60. A first width-wise extending bend axis 76 extends from the notch 72 to the notch 74. A first lengthwise extending bend axis 78 extends from the baseplate's peripheral edge 54 to the bottom of the notch 72. A second lengthwise extending bend axis 80 extends from the peripheral edge 54 to the bottom of the notch 74. These axes 76, 78 and 80 define bend lines along which the baseplate will be bent to form a front wall 82 (bounded by the edge 54 and axes 76, 78 and 80) and first and second tabs 84, 86. The combination of the front wall 82 and the tabs 84, 86 is referred to herein as a front wall piece, the ends of which consist of the tabs 84 and 86. The actual bending operations will be described later.

Third and fourth notches 88, 90 are located relatively close to (or coincident with) the major bend axis 68 and extend inwardly from the lengthwise peripheral edges 58 and 60, respectively. Between the third notch 88 and the first notch 72, another (third) lengthwise bend axis 92 is provided. Similarly, a fourth lengthwise bend axis 94 is provided between the second notch 74 and the fourth notch 90. A sidewall piece 96 is contained between the notches 72 and 88 and the bend axis 92. Another sidewall piece 98 is contained between the notches 74 and 90 and the bend axis 94. Ultimately, the side wall pieces 96 and 98 will be bent along the bend axes 92 and 94 to form sidewalls of the finished assembly shown in FIG. 7.

Another pair of notches 100, 102 extend inwardly from the peripheral edges 58 and 60, respectively. These notches, along with the notches 88 and 90, define another pair of tabs 104 and 106 which will be formed by bending along a corresponding pair of bend lines 108 and 110.

Referring to the baseplate's second part 69, the outer periphery thereof (the part not covered by the insulating film 62) essentially acts as a mounting flange in which notches 112, 114 and 116 may be formed for the purpose of receiving fasteners to hold the assembly 50 to a surface on which the assembly 50 is to be mounted. FIG. 7 which shows the final shape of the assembly 50 also better illustrates the function of the flange portion 118 of the baseplate.

To facilitate bending the baseplate 50, the insulating film preferably includes openings 120 which expose the underlying surface of the baseplate. The openings 120 serve the same purpose as the openings 33 shown in FIG. 3, namely, to receive raised portions 34 (FIG. 3) of a mandrel around which the baseplate may be bent so as to avoid contact between the mandrel and circuit paths on the insulating film 62.

Figure 5:
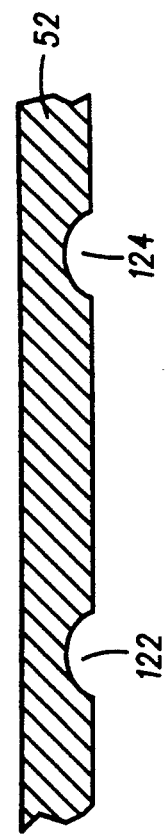
FIG. 5 is a cross-sectional view of a portion of the baseplate shown in the FIG. 4.

To further facilitate bending the baseplate, the thickness of the baseplate is reduced along both major bend axes 68 and 70. As best shown in FIG. 5, a groove 122 is formed on the side of the baseplate 52 that is opposite the side that carries the insulating film 62. This groove 62 preferably extends completely across the width-wise dimension of the baseplate and is situated below the major bend axis 68. Another groove 124 in the baseplate is situated below the other major bend axis 70. Both these grooves are preferably coined with a radiused punch to displace metal from the area of the intended groove. Alternately, the grooves can be formed by scoring, machining, laser cutting, etc.

One of the prime advantages of the structure shown in FIG. 4 is that it permits the use of a single, unitary piece (the baseplate) which can be relatively easily formed to provide a sealable enclosure for electronic components. Conventional single piece enclosures are difficult to seal, and are frequently too flexible to protect soldered joints against shock and vibration.

Conventional enclosures formed from several pieces are less desirable than single-piece enclosures because they tend to be more costly and they substantially complicate the logistics of just-in-time manufacturing. Further, separate pieces forming an enclosure interrupt the heat transfer path, resulting in less than optimum transfer of heat from the enclosed components to the ambient environment.

The present invention provides an enclosure that is formed from a single piece (the baseplate 52) that is specially adapted for ease of handling during manufacture and that can be easily sealed.

An aspect of the FIG. 1 embodiment that results in the advantages noted above is that the lengthwise edges 58 and 60 of the baseplate are substantially continuous and parallel to each other except for the illustrated notches. No protrusions or extensive cut-outs from the lengthwise edges of the baseplate prevent the baseplate from being handled and processed as a flat, rectangular plate.

To allow an electrical connection to be made from the electrical components 66 to the outside world, provision is made for a male connector (not shown). The pins of such a connector are received by holes 126 formed in the insulating film 62, and the holes are electrically connected via circuit paths 64 to the electrical components 66. To support such a connector on the assembly 50, an aperture 128 (FIG. 6) may be formed in the second part 69 of the baseplate, immediately beneath the pattern of holes 126.

The formation of the completed assembly begins with providing the flat baseplate 52 which may already be notched as previously described. While the baseplate is still in its flat condition, the insulating film is adhesively bonded to the baseplate, except that the portion of the insulating film that overlies the major bend axes 68 and 70 is left unbonded. The unbonded portion of the insulating film corresponds essentially to that portion of the film which overlies the third portion 71 of the baseplate.

Preferably, the baseplate is dimensioned such that the insulating film 62 does not cover the entire surface of the baseplate. Rather, space is left between the edges of the insulating film and the various bend axes located on the first part 67 of the baseplate to leave room for automatic machine handling and processing of the baseplate and insulating film.

After the insulating film has been bonded to the baseplate, the electronic components 66 are placed on the film and soldered thereto. Next, the baseplate and film are fed to a brake press to begin bending the baseplate along the various bend axes. The bends to be made along the major bend axes 68, 70 are preferably done last. The sequence of making the other bends is not critical.

Typically, the tabs will be bent first. Tabs 104 and 106 are bent up along bend axes 108 and 110, at an angle of about 90° to the flat baseplate. Similarly, tabs 84 and 86 are bent up, along bend axes 78 and 80, at an angle of about 90° to the flat baseplate.

Next, the front wall piece 82 is bent along its bend axis 76 at an angle of about 90°. Similarly, the sidewall pieces 96 and 98 are bent along their axes 92, 94 at an angle of about 90°. Referring briefly to FIG. 6, this results in the sidewalls 96 and 98 forming an overlap with the tabs 104, 106. The other tabs 84 and 86 are substantially perpendicular to the front wall 82, and the same tabs overlap the sidewalls 96 and 98.

The baseplate is now in condition to be bent along the major bend axes 68 and 70. To accomplish this, a mandrel with raised portions is used, as shown in FIG. 3. With the raised portions of the mandrel received by the openings 120 in the insulating film 62, those raised portions bear on the underlying baseplate. The baseplate is now bent over the mandrel and along the bend axes 68 and 70. This bending is made easier by the preformed grooves 122, 124 (FIG. 5) which underlie the major bend axes. When this bending has partially closed the assembly as shown in FIG. 6, the mandrel is removed. Then the baseplate is further bent until it forms the closed assembly 50 shown in FIG. 7. (The insulating film and circuit components are not shown in FIG. 6 in order to simplify that drawing.)

The completed module 50 may be used in various applications having differing sealing requirements. For example, in an application where an unsealed assembly is acceptable, the assembly 50 may require only a clinching operation to lock the assembly into the final shape shown in FIG. 7. If the assembly must be immersible, a sealant may be applied between the tabs and the sidewalls and/or front wall. A hermetically sealed assembly can be made by forming the assembly into its final shape and then welding the seams.

The module assembly described above provides the manufacturing advantages of a single piece product that is adaptable to a variety of sealing requirements. It also provides optimum heat transfer to the ambient environment.

We claim:

1. A unitary, enclosed electronic module assembly, comprising:

a baseplate bounded by first and second, substantially parallel lengthwise peripheral edges, and first and second, substantially parallel widthwise peripheral edges, the baseplate having a central inner surface and at least first and second major bend axes extending widthwise across the baseplate and located near the middle of the baseplate, the baseplate being bent over on itself by approximately 90° along each of the major bend axes to form an enclosure for circuit components to be mounted on the central inner surface;

a front wall piece located at an end of the baseplate, the boundaries of the front wall piece being defined by the first widthwise peripheral edge, first and second notches extending inwardly from the first and second lengthwise peripheral edges of the baseplate, and a first widthwise extending bend axis that runs between the first and second notches, the front wall piece comprising a first tab located between the first notch and the first widthwise peripheral edge, a second tab located between the second notch and the first widthwise peripheral edge, and a front wall located between the first and second tabs, the first tab being bent inwardly approximately 90° along a first lengthwise extending axis that is offset inwardly from the first lengthwise peripheral edge of the baseplate by approximately the depth of the first notch, the second tab being bent inwardly approximately 90° along a second lengthwise extending axis that is offset inwardly from the second lengthwise edge of the baseplate by approximately the depth of the second notch, and the front wall being bent inwardly approximately 90° along the first widthwise extending bend axis;

a first side wall bounded by the first lehgthwise peripheral edge of the baseplate, the first notch and a third notch extending inwardly from the first lengthwise peripheral edge and located approximately on the second major bend axis, the first side wall being bent inwardly approximately 90° along a third lengthwise bend axis extending between the first and third notches;

a second side wall bounded by the second lengthwise peripheral edge of the baseplate, the second notch and a fourth notch extending inwardly from the second lengthwise peripheral edge and located approximately on the second major bend axis, the second side wall being bent inwardly approximately 90° along a fourth lengthwise bend axis extending between the second and fourth notches, whereby said bending of the front wall, the first and second tabs, and the first and second side walls results in an overlap between the first tab and the first side wall, and another overlap between the second tab and the second side wall to facilitate sealing the interior of the enclosure.

* * * * *